(12) United States Patent
Burlison (10) Patent No.: US 7,032,145 B1
(45) Date of Patent: Apr. 18, 2006

(54) SYSTEM FOR DYNAMIC RE-ALLOCATION OF TEST PATTERN DATA FOR PARALLEL AND SERIAL TEST DATA PATTERNS

(75) Inventor: Phillip D. Burlison, Morgan Hill, CA (US)

(73) Assignee: Inovys Corporation, Pleasanton, CA (US)

( * ) Notice: Subject to any disclaimer, the term of this patent is extended or adjusted under 35 U.S.C. 154(b) by 420 days.

(21) Appl. No.: 10/173,199

(22) Filed: Jun. 14, 2002

Related U.S. Application Data (60) Provisional application No. 60/298,545, filed on Jun. 14, 2001.

(51) Int. Cl.
G01R 31/28 (2006.01)
(52) U.S. Cl. .......................... 714/724; 714/25
(58) Field of Classification Search ................ 714/738, 714/724, 727
See application file for complete search history.

(56) References Cited

U.S. PATENT DOCUMENTS

| | | | |
|---|---|---|---|
| 5,432,797 A * | 7/1995 | Takano ....................... 714/718 |
| 5,510,704 A * | 4/1996 | Parker et al. ............. 324/158.1 |
| 5,606,568 A * | 2/1997 | Sudweeks ..................... 714/729 |
| 6,412,087 B1 * | 6/2002 | Matsumoto .................. 714/738 |
| 6,430,718 B1 * | 8/2002 | Nayak ......................... 714/727 |

OTHER PUBLICATIONS

Samad et al., "Automating ASIC Design-For-Testability—the VLSI Test Assistant", 1989 International Test Conference, IEEE, paper 36.1, pp 819-828.*

* cited by examiner

*Primary Examiner*—Albert Decady
*Assistant Examiner*—John P. Trimmings (57) ABSTRACT

A single memory automated test equipment (ATE) system having multiple pin segments with dynamic pin reallocation. Each pin segment having a length 2n is coupled to the single memory by a parallel in/parallel out shift register that also has a length 2n. The single memory is used to store both parallel data vectors and serial data vectors. Each output of the shift register is coupled to one pin of the corresponding pin segment. Selected, e.g., every other output of the shift register is also coupled to a data selection circuit associated with each pin of the pin segment. The contents of the shift register may be divided into a number of equal length serial data streams. The data selection circuit provides for coupling any serial data stream from the shift register to any pin within the pin segment, and for coupling a single serial data stream to more than one pin.

38 Claims, 11 Drawing Sheets

| | PARALLEL VECTOR WORD 1 VECTOR/PIN/ WORD | SCAN WORD TYPE A 1 SCAN CHAIN/ WORD | SCAN WORD TYPE B 2 SCAN CHAINS/ WORD | SCAN WORD TYPE C 4 SCAN CHAINS/ WORD | SCAN WORD TYPE D 8 SCAN CHAINS/ WORD |
|---|---|---|---|---|---|
| Q0 | Pin j | CHAIN 1 OUTPUT | CHAIN 1 OUTPUT | CHAIN 1 OUTPUT | CHAIN 1 OUTPUT |
| Q1 | Pin j+1 | - | - | - | CHAIN 5 OUTPUT |
| Q2 | Pin j+2 | - | - | CHAIN 3 OUTPUT | - |
| Q3 | Pin j+3 | - | - | - | CHAIN 3 OUTPUT |
| Q4 | Pin j+4 | - | - | - | CHAIN 6 OUTPUT |
| Q5 | Pin j+5 | - | - | - | - |
| Q6 | Pin j+6 | - | - | - | - |
| Q7 | Pin j+7 | - | - | - | - |
| Q8 | Pin j+8 | - | CHAIN 2 OUTPUT | CHAIN 2 OUTPUT | CHAIN 2 OUTPUT |
| Q9 | Pin j+9 | - | - | - | CHAIN 7 OUTPUT |
| Q10 | Pin j+10 | - | - | - | - |
| Q11 | Pin j+11 | - | - | - | - |
| Q12 | Pin j+12 | - | - | CHAIN 4 OUTPUT | CHAIN 4 OUTPUT |
| Q13 | Pin j+13 | - | - | - | - |
| Q14 | Pin j+14 | - | - | - | CHAIN 8 OUTPUT |
| Q15 | Pin j+15 | - | - | - | - |

| | Pin j | Pin j+1 | Pin j+2 | Pin j+3 | Pin j+4 | Pin j+5 | Pin j+6 | Pin j+7 | Pin j+8 | Pin j+9 | Pin j+10 | Pin j+11 | Pin j+12 | Pin j+13 | Pin j+14 | Pin j+15 |
|---|---|---|---|---|---|---|---|---|---|---|---|---|---|---|---|---|
| cycle n (parallel) | V1 | V2 | V3 | V4 | V5 | V6 | V7 | V8 | V9 | V10 | V11 | V12 | V13 | V14 | V15 | V16 |
| cycle n+1 (parallel) | V17 | V18 | V19 | V20 | V21 | V22 | V23 | V24 | V25 | V26 | V27 | V28 | V29 | V30 | V31 | V32 |
| cycle n+2 (scan) | V17 | V18 | *V43* | V20 | V21 | V22 | V23 | V24 | V25 | V26 | *V63* | V28 | V29 | V30 | V31 | *V53* |
| cycle n+3 (scan) | V17 | V18 | *V44* | V20 | V21 | V22 | V23 | V24 | V25 | V26 | *V64* | *V33* | V29 | V30 | V31 | *V54* |
| cycle n+4 (scan) | V17 | V18 | *V45* | V20 | V21 | V22 | V23 | V24 | V25 | V26 | *V65* | *V34* | V29 | V30 | V31 | *V55* |
| cycle n+5 (scan) | V17 | V18 | *V46* | V20 | V21 | V22 | V23 | V24 | V25 | V26 | *V66* | *V35* | V29 | V30 | V31 | *V56* |
| cycle n+6 (scan) | V17 | V18 | *V47* | V20 | V21 | V22 | V23 | V24 | V25 | V26 | *V67* | *V36* | V29 | V30 | V31 | *V57* |
| cycle n+7 (scan) | V17 | V18 | *V48* | V20 | V21 | V22 | V23 | V24 | V25 | V26 | *V68* | *V37* | V29 | V30 | V31 | *V58* |
| cycle n+8 (scan) | V17 | V18 | *V49* | V20 | V21 | V22 | V23 | V24 | V25 | V26 | *V69* | *V38* | V29 | V30 | V31 | *V59* |
| cycle n+9 (scan) | V17 | V18 | *V50* | V20 | V21 | V22 | V23 | V24 | V25 | V26 | *V70* | *V39* | V29 | V30 | V31 | *V60* |
| cycle n+10 (scan) | V17 | V18 | *V51* | V20 | V21 | V22 | V23 | V24 | V25 | V26 | *V71* | *V40* | V29 | V30 | V31 | *V61* |
| cycle n+11 (scan) | V17 | V18 | *V52* | V20 | V21 | V22 | V23 | V24 | V25 | V26 | *V72* | *V41* | V29 | V30 | V31 | *V62* |
| cycle n+12 (parallel) | V73 | V74 | V75 | V76 | V77 | V78 | V79 | V80 | V81 | V82 | V83 | V84 | V85 | V86 | V87 | V88 |

FIGURE 9

| | SERIAL ENABLE | SHIFT COUNT | D0 | D1 | D2 | D3 | D4 | D5 | D6 | D7 | D8 | D9 | D10 | D11 | D12 | D13 | D14 | D15 |
|---|---|---|---|---|---|---|---|---|---|---|---|---|---|---|---|---|---|---|
| WORD 0 | 0 | 0 | V1 | V2 | V3 | V4 | V5 | V6 | V7 | V8 | V9 | V10 | V11 | V12 | V13 | V14 | V15 | V16 |
| WORD 1 | 0 | 0 | V17 | V18 | V19 | V20 | V21 | V22 | V23 | V24 | V25 | V26 | V27 | V28 | V29 | V30 | V31 | V32 |
| WORD 2 | 1 | 3 | V33 | V34 | V35 | V36 | V43 | V44 | V45 | V46 | V53 | V54 | V55 | V56 | V63 | V64 | V65 | V66 |
| WORD 3 | 1 | 3 | V37 | V38 | V39 | V40 | V47 | V48 | V49 | V50 | V57 | V58 | V59 | V60 | V67 | V68 | V69 | V70 |
| WORD 4 | 1 | 1 | V41 | V42 | - | - | V51 | V52 | - | - | V61 | V62 | - | - | V71 | V72 | - | - |
| WORD 5 1015 | 0 | 1 | V73 | V74 | V75 | V76 | V77 | V78 | V79 | V80 | V81 | V82 | V83 | V84 | V85 | V86 | V87 | V88 |

SYSTEM FOR DYNAMIC RE-ALLOCATION OF TEST PATTERN DATA FOR PARALLEL AND SERIAL TEST DATA PATTERNS

RELATED U.S. PATENT APPLICATION

This patent application claims the benefit of U.S. Provisional Application No. 60/298,545, filed Jun. 14, 2001 by Phillip D. Burlison.

FIELD OF THE INVENTION

The present invention relates to test data pattern designs used in automated integrated circuit test equipment. More specifically, embodiments of the invention provide efficient memory utilization and flexible data output during the testing of integrated circuits using serial scan test patterns.

BACKGROUND ART

Automatic Test Equipment (ATE) for digital Integrated Circuits (ICs) is required to provide a flow of digital data that is used to generate the input signals required to stimulate the IC under test and to provide the expected response data that is compared to the output data generated by the IC. This digital data is referred to as "test pattern data."

Figure 1:
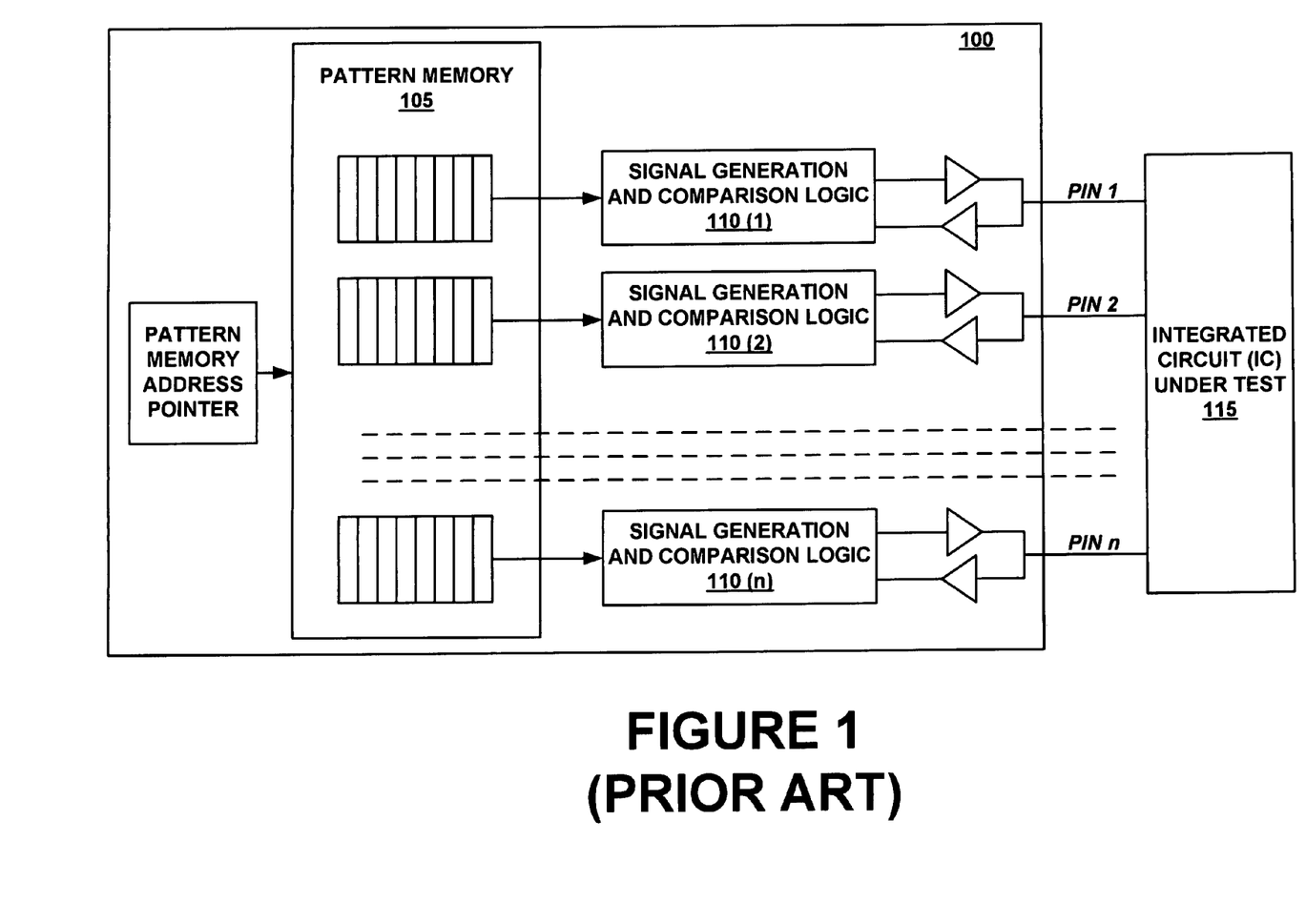
FIG. 1 shows an automated test equipment (ATE) having a single memory with pattern memory corresponding to each pin.

Prior Art FIG. 1 depicts a simplified diagram of an ATE system 100 and an integrated circuit under test 115. Test pattern data is read from the tester's pattern memory 105 in the form of "vectors," where each vector contains a set of individual "pin-vector" data. Each individual "pin-vector" may be comprised of 1, 2, 3, or possibly more bits which represents a potential new state of data at a specific signal pin. Automatic Test Equipment is configured with some finite number of signal "pins" (Pin 1, Pin 2 ... Pin n), where each signal pin is to be connected to a physical signal pin of the integrated circuit under test. The typical number of pins found on state of the art ATE is in the range of 256 to 1024 pins. For each pin implemented in the ATE, there would be a memory for storing the test pattern and signal generation/comparison circuitry 110(1) to 110(n) for generating the appropriate waveform as specified by the pin-vector data and for also comparing data received from the IC against the pin-vector data.

Depending upon the complexity of the IC, the amount of test pattern data required to sufficiently test a digital IC can be from a few hundred-thousands to several million vectors. Each digital signal pin of an IC is typically categorized as one of three (3) types: an "input" pin is capable of only "receiving" signals from the IC tester; an "output" pin is capable only of "outputting" signals to the IC tester; and a "bi-directional" pin is capable of switching back and forth between being an input and an output pin from one data cycle to another.

There are two general methods used for the application of test pattern data to the IC. The first method requires that test pattern data be applied in parallel to all signal pins of the IC in each and every vector. This method is required to "functionally" test the device. The second method utilizes additional logic circuitry added to the IC to enable the test pattern data to be applied to a smaller subset of the signal pins, with the data being "serially" redistributed within the IC itself to all of the internal logic functions for testing. This addition of logic is referred to as adding Design For Test (or DFT) and the method used to subsequently test the IC is referred to as "structural" testing.

Parallel test pattern vectors are provided to all pins of the IC at a specific programmed rate which is determined by the IC's specified operating rate against which it is being tested. During the test of a digital integrated circuit, these "parallel" test patterns require that unique pattern data be applied to all signal pins of the device on each data cycle.

Conversely, serial test patterns are serially shifted into an IC's internal memory elements through a small set of external serial data input pins called "scan-in pins." After the IC's internal shift register memory has been fully loaded with the desired pattern, the internal test pattern data is then applied to the internal logic and the resultant output of the logic being tested is captured back into the IC's serial shift register memory. The resultant data is then serially shifted out through a small set of external serial data output pins called "scan-out pins." The data is compared against the expected results as it is being shifted out, and any variation between shifted data and expected results indicates a defective IC. To completely test an IC, this process is typically repeated several hundreds or thousands of times.

Importantly, in between each serial shift-in/shift-out sequence, a small sequence of parallel vectors may be applied to all of the IC pins.

Figure 2:
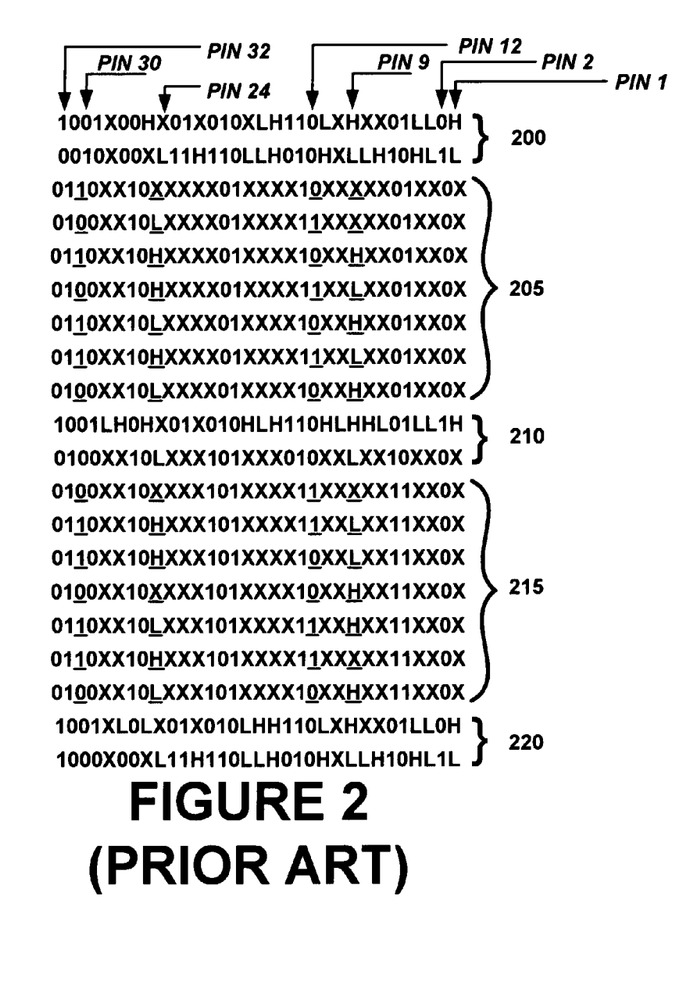
FIG. 2 shows an example a test vector array having interleaved parallel and serial test vector sequences.

Prior Art FIG. 2 depicts an example of the interleaving of parallel and serial test vectors. Each line in the figure represents the vector data for one test cycle. Each column represents the activities on a single signal pin of the IC. Each individual character represents a "pin-vector," which specifies the test activity that is to occur on that signal pin during that cycle. In the example given, the following pin-vector characters would specify the following actions: "0"—apply a low input data level to the IC pin; "1"—apply a high input data level to the IC pin; "L"—test the output of the IC pin for a valid low data level; "H"—test the output of the IC pin for a valid high data level; and "X"—allow the IC to output data, but do not test its data state.

In FIG. 2, sequences 200, 210 and 220 are parallel vector sequences, where unique data is applied to all signal pins for functional testing. Interleaved with the parallel vector sequences are serial scan vector sequences 205 and 215 for structural testing. In the serial scan vector sequences, data may be applied or tested on a small subset of the pins. During the cycles in which a serial data pattern is being applied to the serial pins, the values applied to the non-serial pins are fixed.

In the example of FIG. 2, there are thirty-two (32) total signal pins, and four (4) serial scan pins (pins 9, 12, 24, and 30). In the figure, the serial pin-vectors are indicated by underlined bold characters. In this example, pin 30 and pin 12 are scan-in pins while pin 24 and pin 9 are scan-out pins.

The ratio of the number of serial vectors to the parallel vectors required to test an IC may be several hundred to one. The number of serial pins used as a ratio to the total number of parallel signal pins varies with the IC design. A representative set of test pattern parameters for structurally testing an IC is shown in Table 1.

TABLE 1

| | |
|---|---|
| Total number of signal pins | 384 |
| Total number of serial pins. | 16 |
| Total number of parallel vectors (on all pins)" | 40,000 |
| Total number of serial vectors (on serial pins)" | 20,000,000 |
| Total number of pin-vectors required. | 335,360,000 (384 × 40,000 + 16 × 20,000,000) |

Design approaches used by automatic test equipment to generate, store, and deliver the above type of data pattern sequences has generally relied on one of three different implementations.

The first conventional implementation utilizes the basic pattern memory 105 depicted in FIG. 1. The architecture of FIG. 1 requires that unique pin-vector pattern data be stored for every pin (both parallel and serial pins) for every cycle (both parallel and serial vector cycles). This means that pattern data on the non-serial data pins is replicated for every serial vector as shown in region 205 of FIG. 2. The advantage to this approach is that it does not require any incremental change to the basic parallel tester design to implement. However, the overwhelming constraint is the enormous amount of pattern memory required for typical scan based test applications. Most of the memory is used to store duplicate pattern data. Based on the parameters given in Table 1, system 100 would require a pattern memory capable of holding almost eight billion pin vectors, which is more than twenty times greater than what would be required in the alternative implementations described below.

Figure 3:
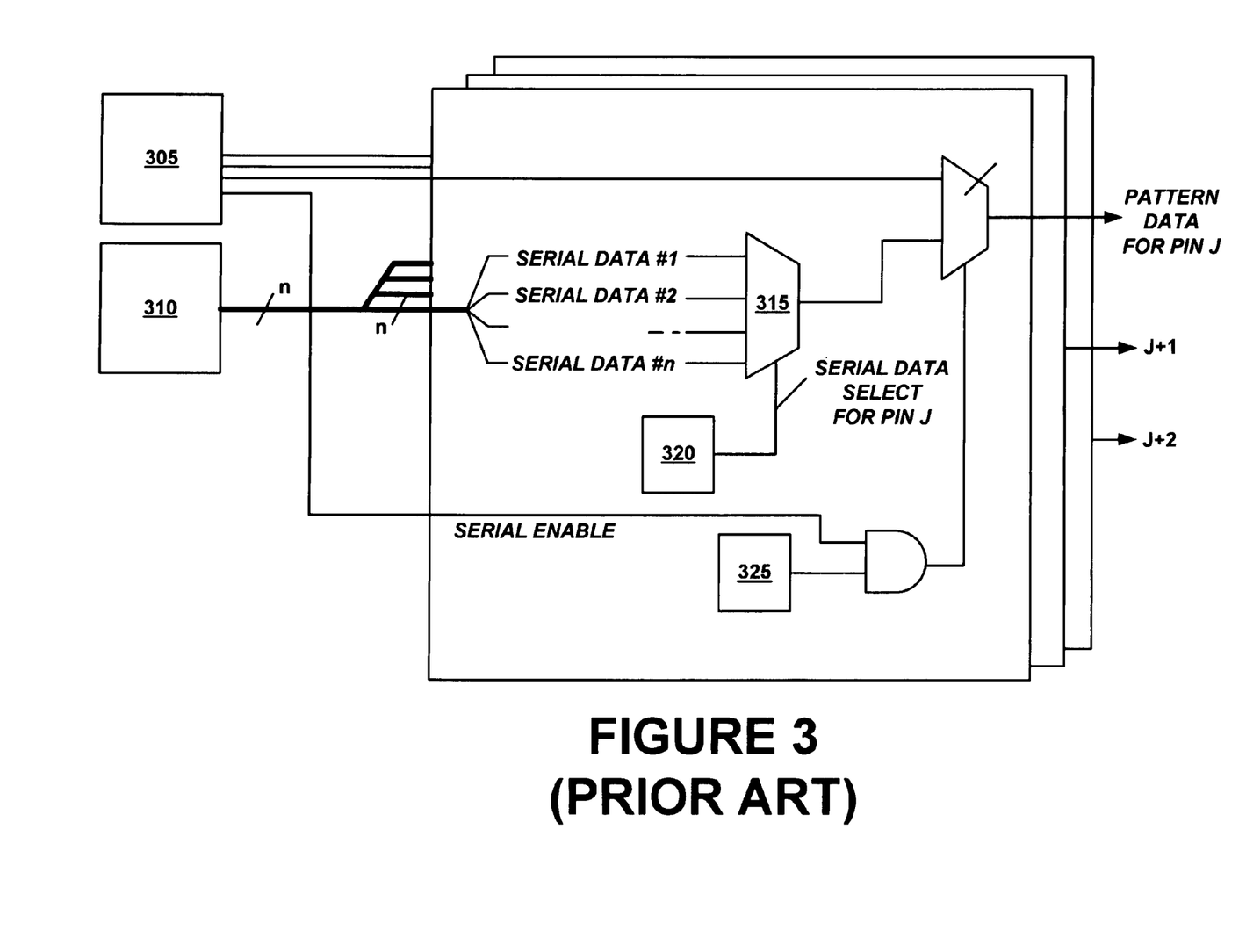
FIG. 3 shows an automated test equipment (ATE) having a memory for serial vector data and a memory for parallel vector data.

The second conventional implementation shown in FIG. 3 and uses two separate memories, e.g., a first memory 305 that is used to store the parallel vector data, and a second memory 310 for storing serial vector data. This implementation has multiplexer 315 and multiplexer 316. Memory 305 stores the parallel vector data for every tester channel and memory 310 stores the serial vector data patterns. Serial vector memory 310 is organized with deeper depth but narrower width than memory 305. As an example, for a 512 pin tester memory 305 might have 4 million locations with 512 pin-vectors (one per pin) stored at each location. Memory 310 might have 256 million locations with each location storing 16-pin-vectors. Memory 310 would also typically be software reconfigurable to provide longer serial vector sequences at the expense of fewer serial data channels (e.g., 8 channels by 512M deep).

Each individual tester channel would be implemented with a 16 to 1 data multiplexer 315 which is controlled by register 320. Register 325 would be set for those pins for which a serial data pattern is generated during scan pattern sequences. During the execution of serial vector sequences (as enabled by the Serial Enable signal from memory), the parallel vector memory would remain on the last parallel vector executed.

While this method provides deeper serial depth and better memory utilization, it has two major disadvantages. The first disadvantage is that the distribution of the serial memory outputs to all of the other tester pins is typically very complex and expensive (the distribution cost may be more than the cost of the memory itself). The second disadvantage is that the maximum serial memory width is limited in practice to about 16 serial channels because of the complexity of the distribution and multiplexer logic. The limitation of providing only 16 serial channels means only 16 scan chains can be supported for any serial scan cycle.

Figure 4:
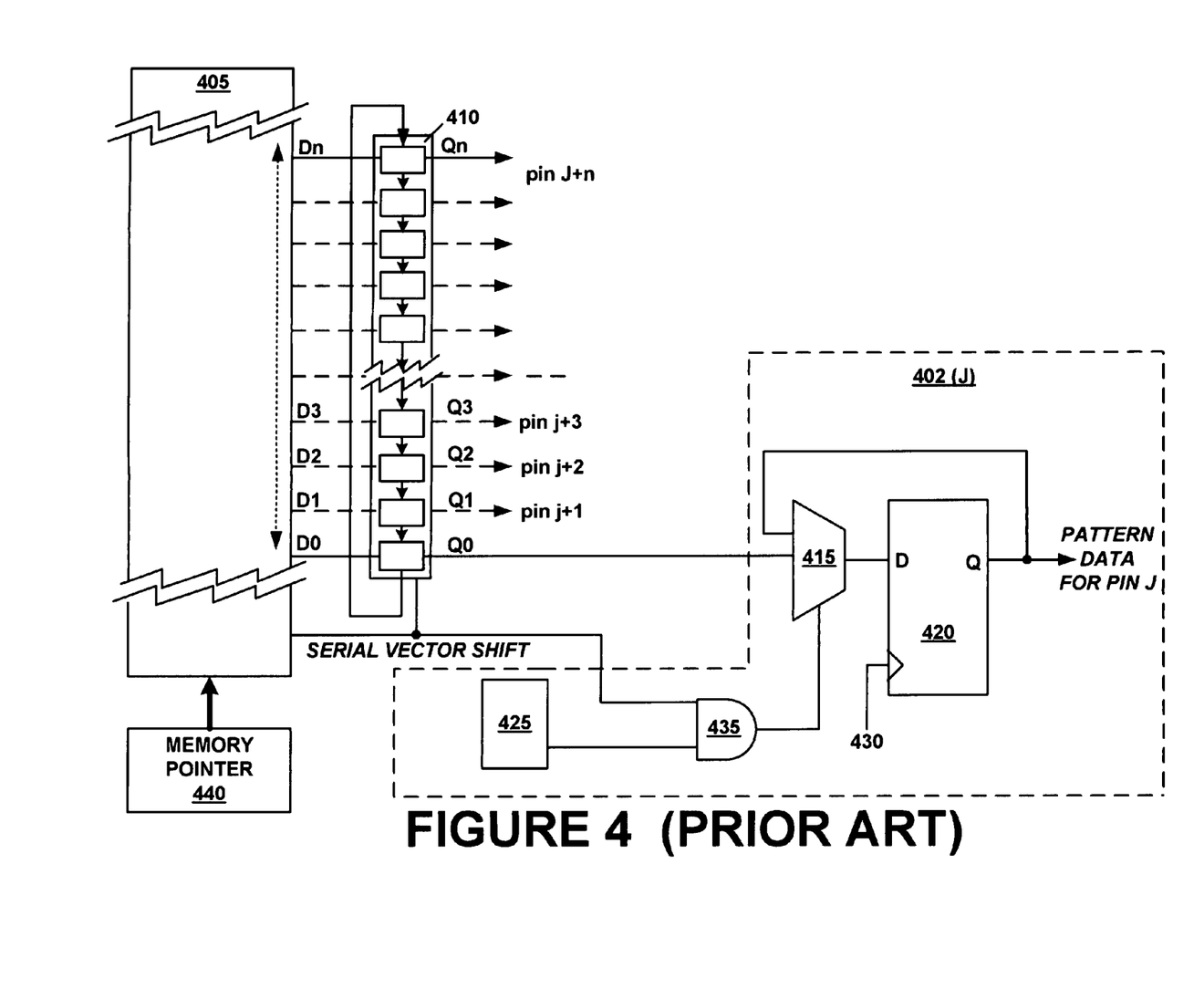
FIG. 4 shows an automated test equipment (ATE) having a single memory for serial vector and parallel vector data and evenly distributed serial pins within a pin segment.

A third conventional implementation is depicted in Prior Art FIG. 4. This implementation utilizes a single memory 405 to store both parallel (functional) and serial (structural) vector data. The output of memory 405 is wide enough to provide parallel data for all tester pins. The pin population is further divided into smaller fixed length pin segments (represented as pins J through J+n in FIG. 4). The vector pattern segment from memory 405 (D0–Dn) for each segment goes to the inputs of parallel-in/parallel-out shift register 410. One of these shift registers 410 is provided for each such segment. Only one segment is shown.

Each parallel output of shift register 410 (Q0–Qn) is connected to respective multiplexer 415 of each pin circuitry 402(j). Only the connection of Q0 is shown. Multiplexer 415 is controlled by the output of AND gate 435. During parallel vector sequences the data passes through shift register 410 into register 420 on each clock cycle signal 430, and subsequently to the pin logic through the register 420 output.

Conversely, during a serial data sequence, memory pointer 440 holds the present memory address while the data loaded into shift register 410 is serially shifted. Each pin may be individually programmed to either output the data from the shift register 410 during these shift cycles, or to maintain the data last output prior to a shift signal going true. This is determined by the state programmed into each pin's data hold register 425.

Depending upon the number of serial pins located in any segment, the data in the shift register 410 is serially shifted such that the data appears at the pin(s) assigned as serial data pins. While this approach has advantages over the previous implementation, its major disadvantage is that it severely limits the assignment of serial scan-in pins within the pin segment to evenly distributed pins. For example, if the pin segment has 16 pins (n=16) and there are two serial scan-in pins required within a sixteen pin segment, each pattern vector word could then contain two serial vector sequences of only 8 vectors each. However, the two serial pins would have to be selected so that they are exactly 8 pins apart. In practice the outputs of register 410 are essentially dedicated to a particular pin as the scan-in pin so that unique data can be provided for serial scan-in. This is often a major constraint on the use of this implementation.

SUMMARY OF INVENTION

Accordingly, what is needed is an improved ATE system that provides more flexibility in the placement of scan-in pins for serial shift test data. More specifically, what is needed is an ATE system that allows the efficient use of a single memory while allowing flexibility in the routing of serial and parallel data. What is further needed is an ATE system that can provide efficient memory usage and flexible routing without requiring a complex routing scheme. The embodiments of the present invention provide such advantages. These and other aspects of the present invention not recited above will become clear within the descriptions of the present invention presented below.

A single memory automated test equipment (ATE) system having multiple pin segments with dynamic pin reallocation is disclosed. Each pin segment having a length 2n is coupled to the single memory by a parallel in/parallel out shift register that also has a length 2n. The single memory is used to store both parallel data vectors and serial data vectors. Each parallel output of the shift register is coupled to one pin of the corresponding pin segment. Selected outputs, e.g., every other output, of the shift register are also coupled to a data selection circuit associated with each pin of the pin segment. In one embodiment, the selection circuit is a multiplexer. The contents of the shift register may be divided into a number of equal length serial data streams. The data selection circuit provides for coupling any serial data stream from the shift register to any pin within the pin segment, and for coupling a single serial data stream to more than one pin.

In an embodiment of the present invention, a single memory is used in an ATE system to store both parallel and serial vector data sequences. A parallel in/parallel out shift register with a length 2n couples the single memory to each pin of a pin segment having a length 2n. Every other output of the shift register is also coupled to each pin by a data selection circuit. As a whole, the data selection circuits associated with the pins of the segment serve as a variable width bus for serial vector data, allowing for the selection of (1, 2, 3, . . . n) serial data streams from the shift register. The data selection circuit also provides for the coupling of any of the serial data streams to any pin within the pin segment, thereby providing a mechanism for parallel device testing.

BRIEF DESCRIPTION OF THE DRAWINGS

Prior Art

Prior Art

Prior Art

Prior Art

DESCRIPTION OF THE PREFERRED EMBODIMENTS

Reference will now be made in detail to the embodiments of the invention, a system for dynamic re-allocation of test pattern data for parallel and serial test data patterns, examples of which are illustrated in the accompanying drawings. While the invention will be described in conjunction with the preferred embodiments, it will be understood that they are not intended to limit the invention to these embodiments. The invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Figure 5:
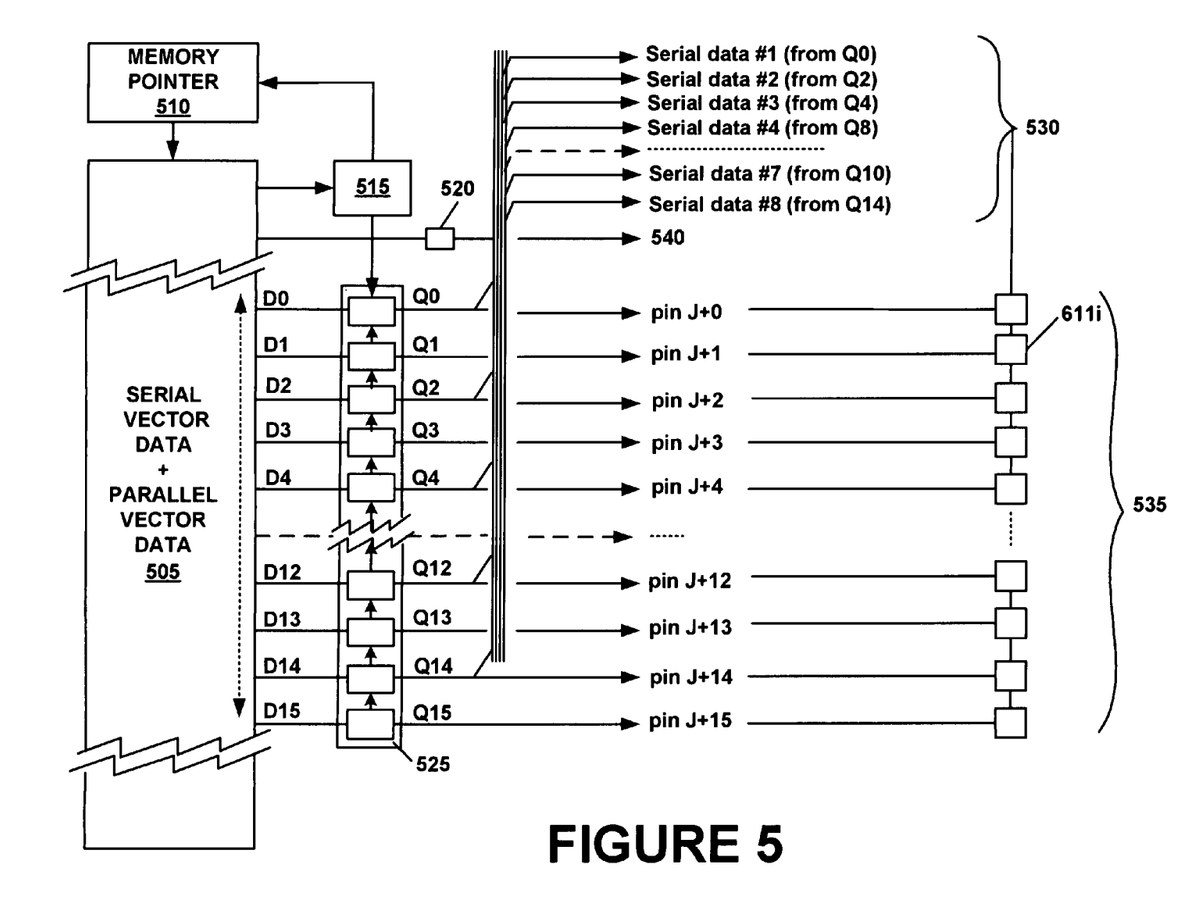
FIG. 5 shows a diagram of a single memory and test pattern data distribution logic in accordance with an embodiment of the present claimed invention.

FIG. 5 shows a diagram of a single memory and test pattern data distribution logic in accordance with an embodiment of the present invention. A single memory 505 is coupled to a parallel in/parallel out shift register 525. The shift register 525 is coupled to a counter 515 that is also coupled to a memory pointer 510 that points to memory locations within memory 505. The data output pins of memory 505 are wide enough to provide parallel data for all tester pins on each data cycle. In addition, the pin population is divided into smaller fixed length pin segments. In the example of FIG. 5, a segment having sixteen (16) pins is used in order to simplify the description, while typical implementations may have more or less pins per segment. Only one of the several possible segments is shown. The sixteen pins in the example are labeled as pins J+0 through J+15.

Initially, a vector data word (DO–DI5) is fetched from memory 505 containing parallel and serial test vectors and is loaded into shift register 525 via the parallel input port on each data cycle. Also, a scan enable bit and a vector shift count is fetched and loaded into register 520 and counter 515 respectively. If the shift count value being loaded into counter 515 is 0, then memory pointer 510 is incremented to point to the next memory location and the next vector word is fetched. If the shift count value is greater than 0 then the memory pointer 510 is maintained and register 520 is not loaded on the data clock cycle. Each output of shift register 525 (Q0–QI5) is coupled to a set of pins 535 for application to a device under test. Additionally, selected pins, e.g., every other output of shift register 525 (Q0, Q2, . . . Q14), is also coupled to a serial vector data bus 530. Generally, the shift register 525 will have a length 2n (n being a positive integer), with every other output (n outputs in all) being coupled to the serial vector data bus 530.

Although every other pin is shown selected, embodiments can also exist that select every pin, every third pin, etc., or every $k^{th}$ pin, as the general case. In the embodiment described herein, every other pin is shown for clarity of discussion and is but one example.

Data loaded in parallel from memory 505 can be provided in parallel over pins j+0 through j+15 or, in shift mode, can be serially shifted through the cells of shift register 525.

Figure 6:
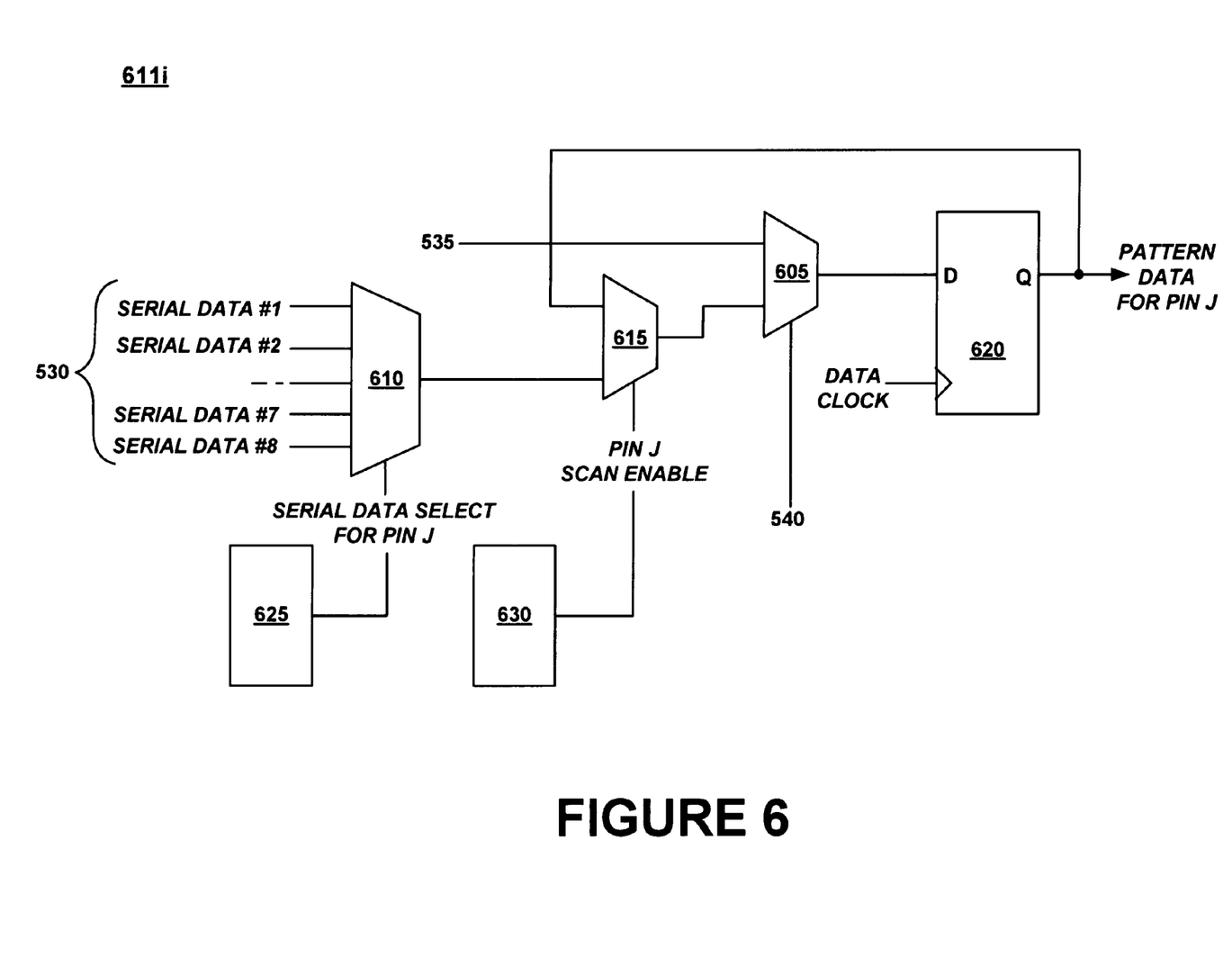
FIG. 6 shows a diagram of a pattern data selection circuit associated with each segment pin in accordance with an embodiment of the present claimed invention.

FIG. 6 shows a diagram of the pattern data distribution logic 611$i$ associated with each of pins j+0 through J+15 in accordance with an embodiment of the present invention. With respect to the bus 535 of FIG. 5, parallel input 535$i$ of FIG. 6 represents one of 16 parallel vector data signals. Similarly, the serial vector enable signal 540 of FIG. 5 is coupled to multiplexer 605 of FIG. 6. If the serial vector enable signal 540 at the output of register 520 is false, then the parallel data 535$i$ is selected by the multiplexer 605 and transferred into register 620 on the next data clock cycle. If the serial vector enable 540 is true, then multiplexer 605 will select the output of Multiplexer 615 to be transferred into register 620 on the next data clock cycle.

The bus 530 is coupled to multiplexor 610 that selects one of the available serial data bus lines from the shift register 525. Thus, any tester pin J+0 through J+15 in the pin segment has access to any of the serial data streams from the shift register 525. Further, more than one pin may select the same serial data bus line, allowing for a single serial data stream to be applied to more than one pin. This pattern duplication provides for parallel testing of devices, e.g., a single 16 pin segment testing two identical eight pin ICs, see FIG. 11.

Multiplexer 615 accepts selected serial data from multiplexer 610 and "recycled" data from register 620 as inputs. The output of multiplexer 615 is determined by the state that has been loaded into each pin's serial pin enable control register 630. If register 630 has been programmed false (pin not a serial vector pin) then the last vector transferred into Register 620 is reloaded; if register 630 has been programmed true (pin is a serial vector pin), then the output of multiplexer 610 (serial data select multiplexer) is transferred into register 620 on the next data clock cycle. Register 625 of each serial pin that has been set is programmed to select which serial data stream bus 530 to use (#1–#8).

Referring again to FIG. 5, if shift counter 515 is greater than 0, then it is decremented on each data clock cycle. The contents of register 525 are serially shifted on each clock cycle for which shift counter 515 is greater than 0. When shift counter 515 reaches 0, then memory pointer 510 is incremented and the next vector word is loaded into Register 525.

Figure 7:
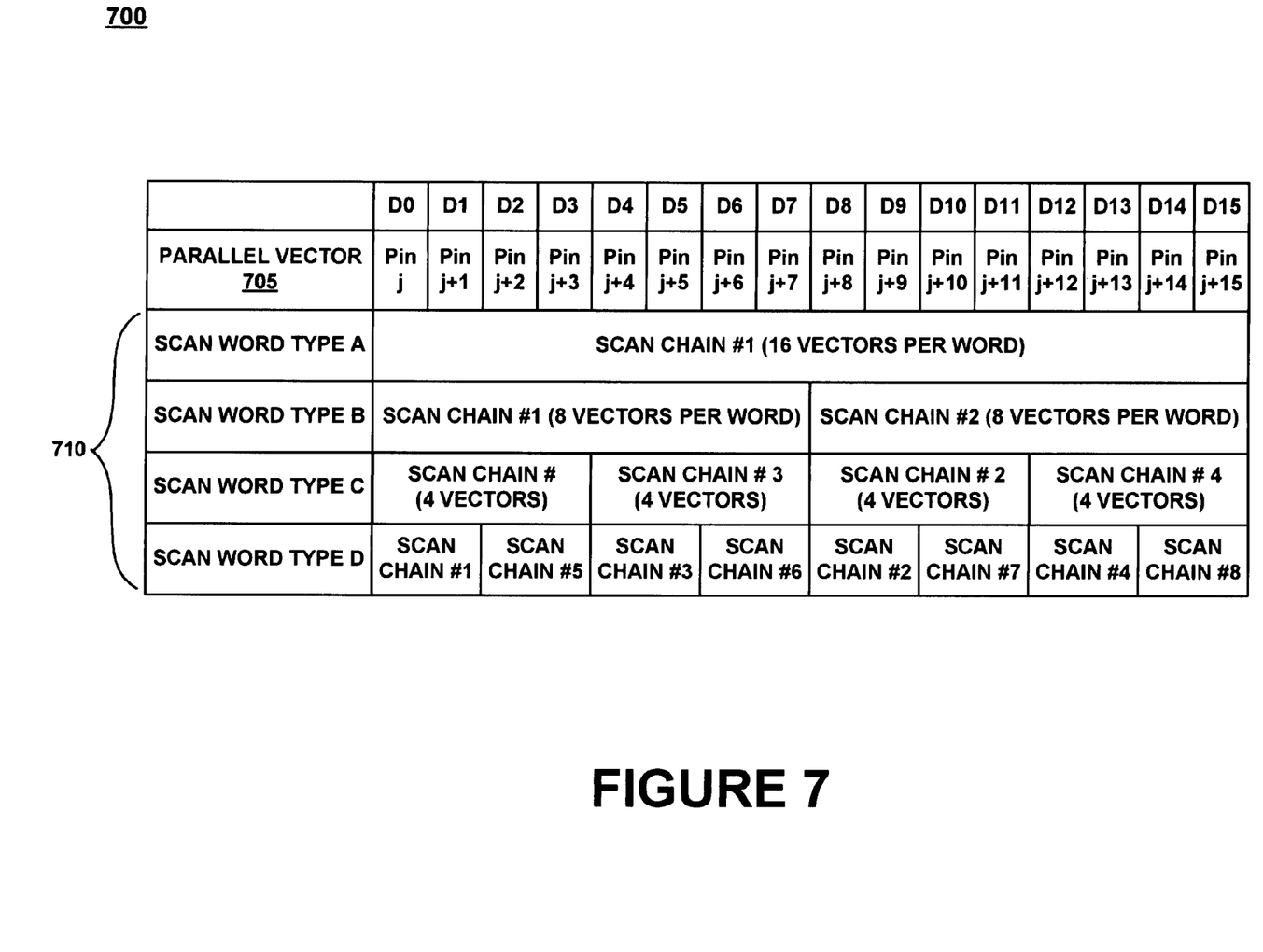
FIG. 7 shows a variety of parallel and serial vector data configurations of a pattern memory word in accordance in accordance with an embodiment of the present claimed invention.

FIG. 7 shows a number of different configurations 700 for data storage in a pattern memory word. The word may contain 16 parallel vectors as shown in parallel configuration 705, or a variety of serial data scan chains having varying lengths in serial configuration 710 (A, B, C, and D). A word containing a parallel vector has dedicated pin-vector for each pin. A word containing serial vectors may contain 1, 2, 4, or 8 serial data chains for a 16 pin segment. For larger pin segments the maximum number of serial chains contained in a word would be half the number of pin-vectors per word (e.g. 1, 2, 4, 8, 16, or 32 for a 64 pin segment).

Figure 8:
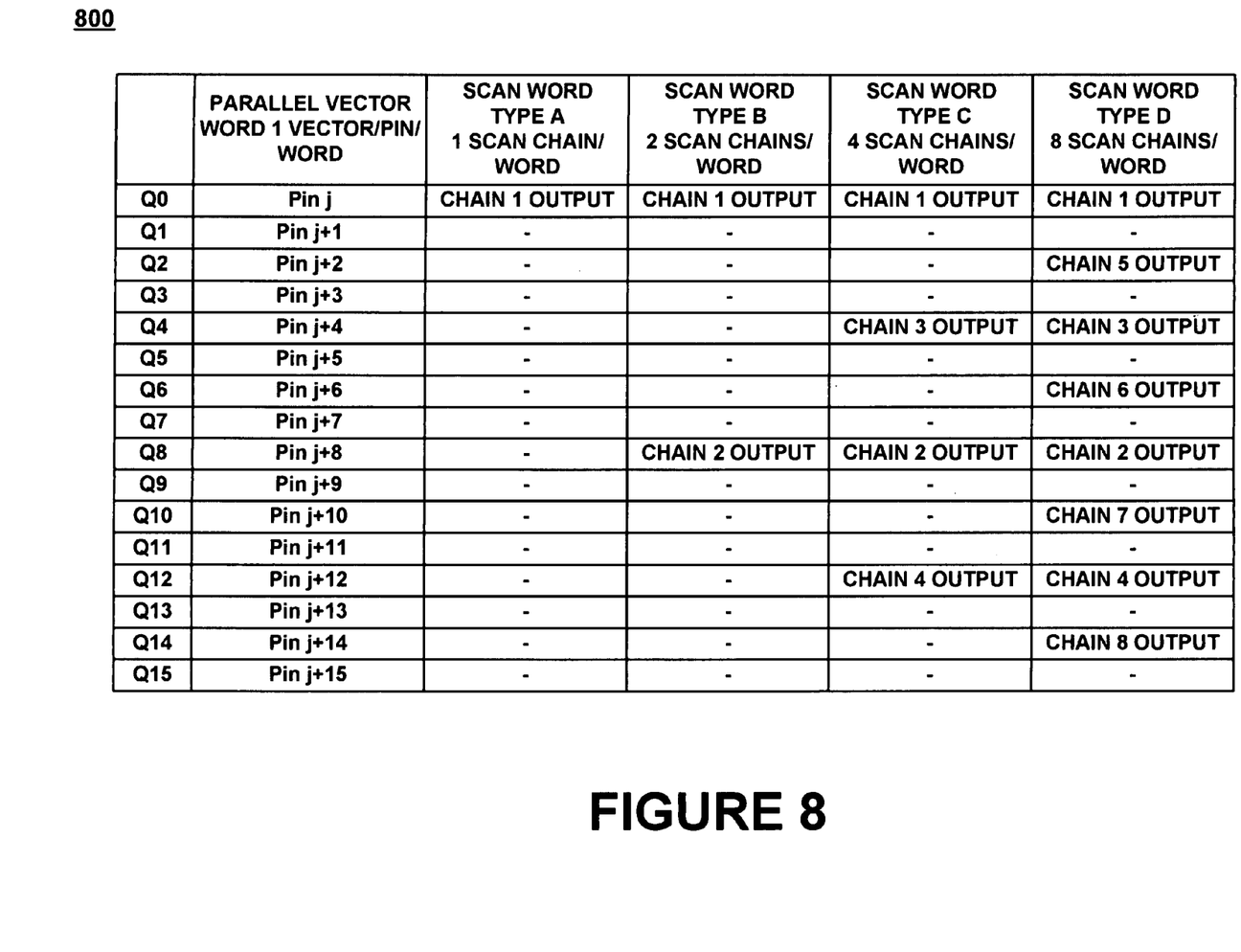
FIG. 8 shows a map of the derivation of words A, B, C, and D of FIG. 7 from shift register 525 shown in FIG. 5 in accordance with an embodiment of the present claimed invention.

FIG. 8 illustrates a mapping 800 of how the serial data chains associated with words A, B, C, and D of FIG. 7 are derived from shift register 525 shown in FIG. 5. The shift register 525 may be tapped at any set of locations that provides for an equal number of vectors being shifted out of each tap.

Figure 9:
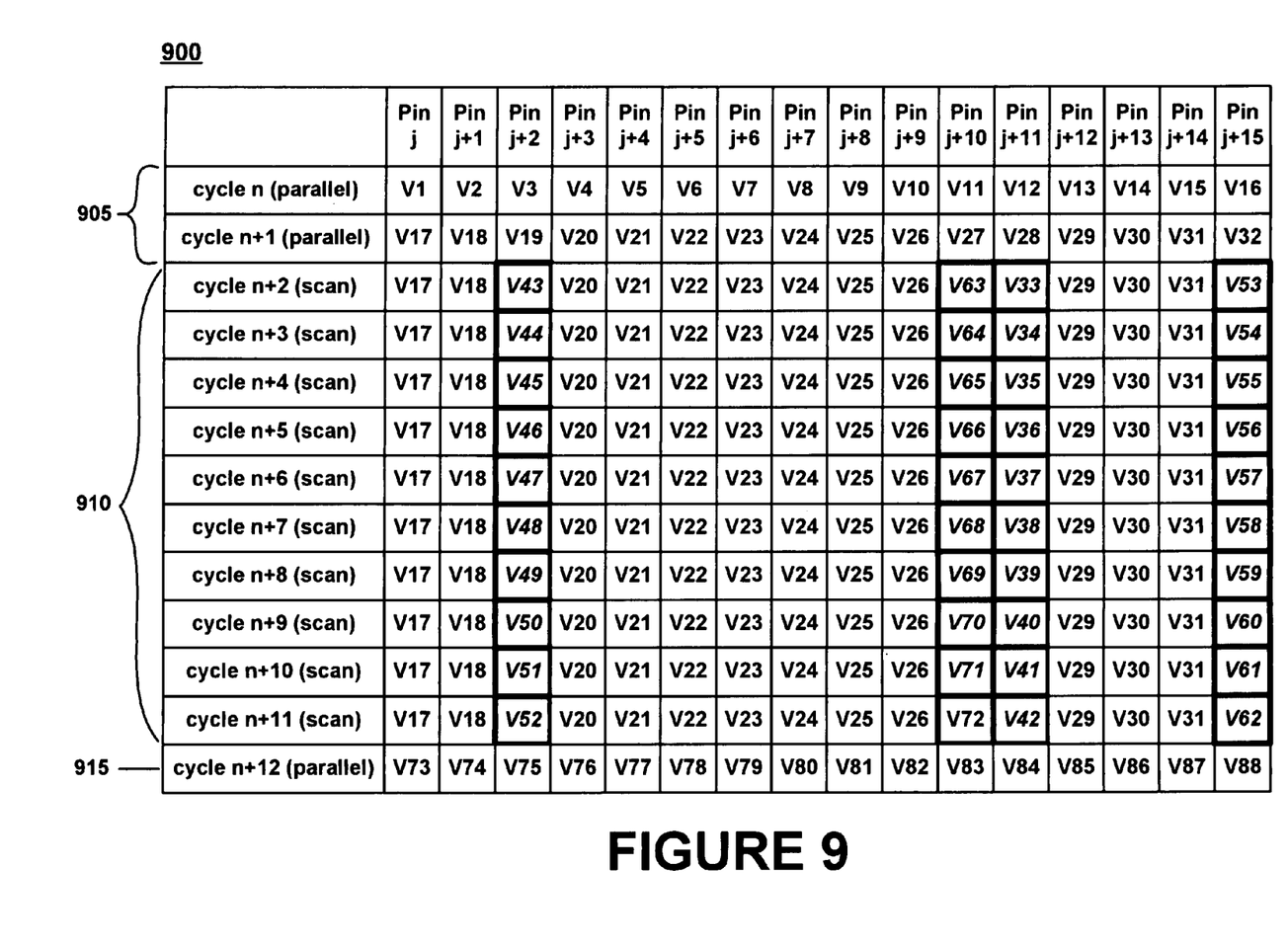
FIG. 9 shows an array of vectors having alternating sequences of parallel and serial vectors for non-uniformly distributed pins, in accordance with an embodiment of the present claimed invention.

FIG. 9 shows an array of vectors 900 having alternating sequences of parallel and serial vectors where each pin-vector is specified as a unique value (V1–V88). The first sequence 905 has two parallel vectors on all pins. The second sequence 910 has 10 cycles containing serial vectors on pins j+2(V43–V52), j+10(V63–V72), j+11(V33–V42), and j+15(V53–V62). The third sequence 915 has a single parallel vector on all pins.

Figure 10:
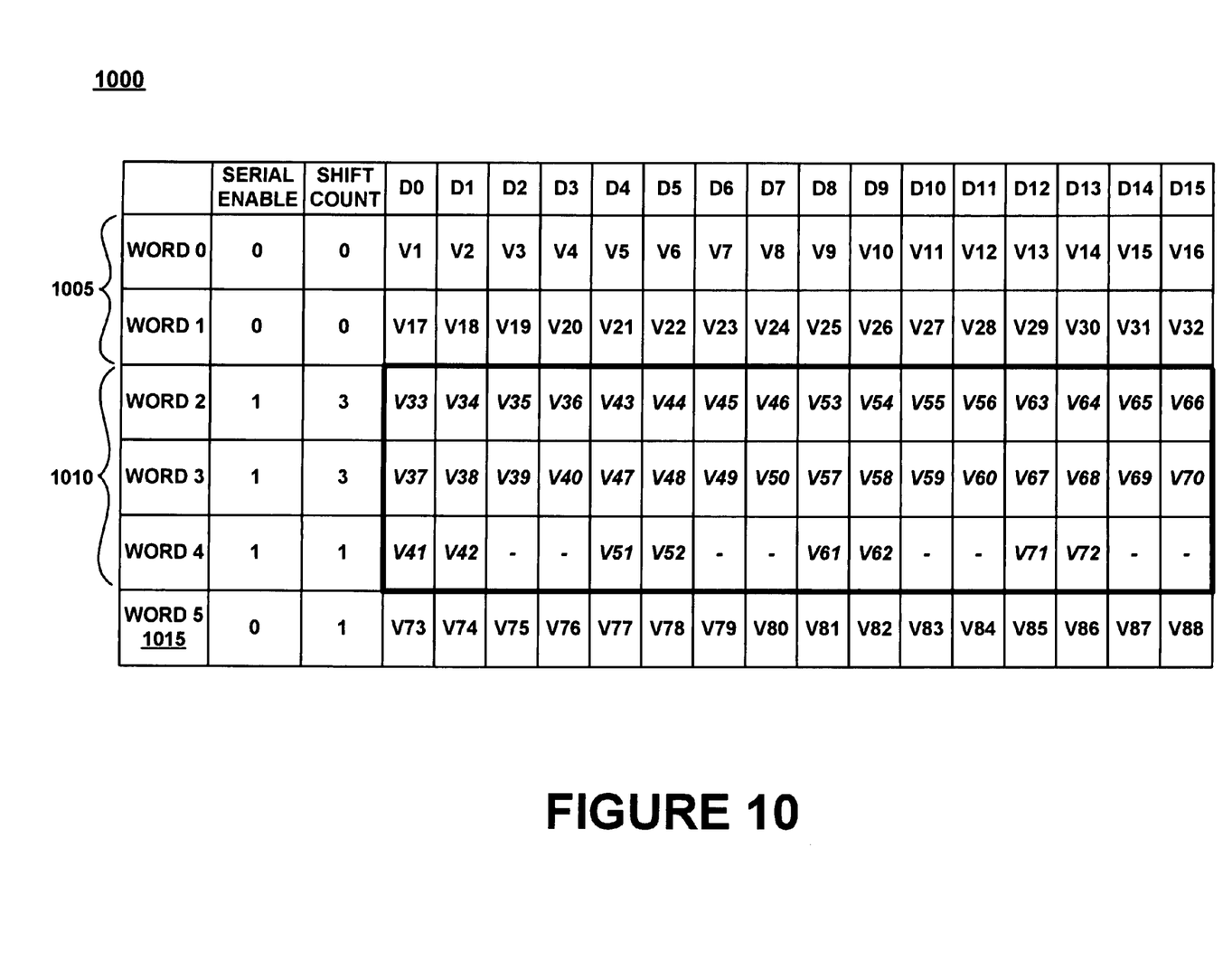
FIG. 10 shows an example of a memory configuration for the vector array of FIG. 9 in accordance with an embodiment of the present claimed invention.

FIG. 10 depicts how the pattern of FIG. 9 may be stored in pattern memory 505. The memory pattern 1000 comprises pattern sets 1005, 1010, and 1015 correspond to the vector sequences 905, 910, and 915, respectively. The serial patterns words 2, 3, and 4 of set 1010 are stored as Type C (4 scan chains per location). Words 2 and 3 contain 4 scan vector per location each, thus the shift count value for each of these words is set to 3. Word 4 contains the final two cycle of scan vectors thus it's shift repeat count value is set to I. The shift count value for all parallel vectors is set to 0. Pin j+2 would be programmed to use serial chain #2, pin j+10 to use chain #4, pin j+11 to use chain #1, and pin j+15 to use chain #3.

Figure 11:
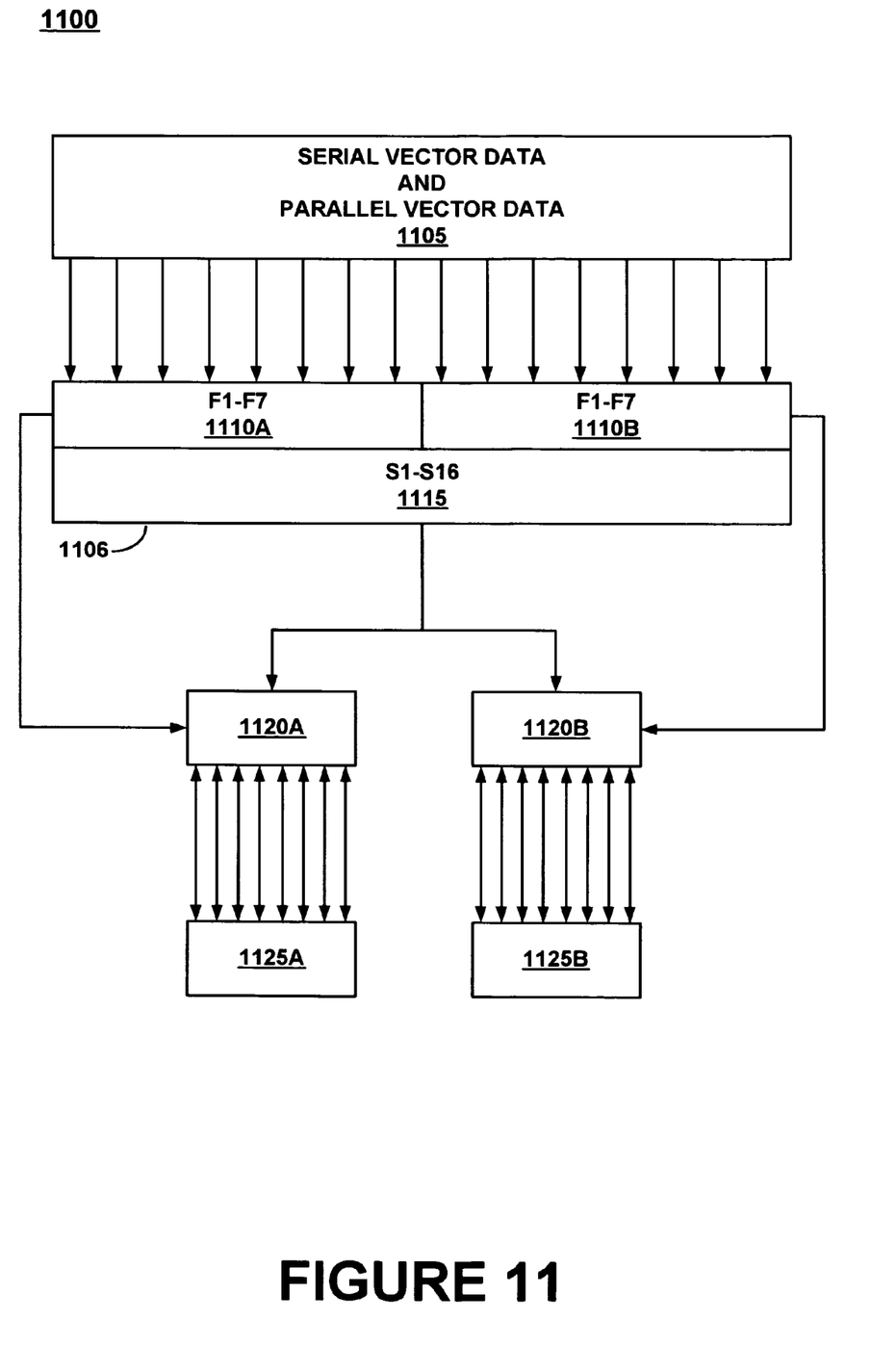
FIG. 11 shows a configuration in which serial data is provided to two devices being tested in parallel in accordance with an embodiment of the present claimed invention.

FIG. 11 shows a parallel test configuration 1100 being used to provide the same data to two devices. A memory 1105 that stores both serial vector data and parallel vector data is coupled to data distribution circuit 1106 comprising parallel outputs 1110A and 1110B, and a serial output 1115. The data distribution circuit is essentially the combination of a parallel in/parallel out shift register and the circuit elements shown in FIG. 5 and FIG. 6. Parallel outputs 1111A and 1110B, and serial output 1115 are coupled to pin formatter/device interface 1120A and 1120B, which are in turn each coupled to devices under test 1125A and 1125B, respectively.

The data shifted into the to data distribution circuit 1106 may be output from either the parallel outputs or the serial outputs. Parallel data F1–F7 is duplicated in each half of the shift register, whereas a single set of serial serves both device interfaces 1120A and 1120B. The flexible distribution of serial data to any pin enables the efficient parallel testing of devices 1125A and 1125B.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

The invention claimed is:

1. An automated test equipment (ATE) system comprising:
a single memory for storing parallel and serial data vector sequences;
a plurality of parallel in/parallel out shift registers coupled to said single memory; and
a plurality of pins divided into pin segments, wherein a pin segment is coupled to one of said parallel in/parallel out shift registers, and,
wherein each pin within said pin segment is configured to receive said serial data vector sequence from said single memory, and
wherein any pin within said pin segment can be selected to function as a serial scan-in pin.

2. The system of claim 1, wherein more than one pin within a pin segment is configured to receive the same serial data vector sequence from said single memory.

3. The system of claim 1, wherein each parallel in/parallel out shift register has length 2n and each pin segment has a length 2n.

4. The system of claim 3, wherein each parallel in/parallel out register is configured to deliver (1, 2, . . . n) serial data vectors.

5. The system of claim 4 further comprising pin logic for each pin and comprising:
a first multiplexer;
a second multiplexer having an input coupled to an output of said first multiplexer; and,
a third multiplexer having an input coupled to an output of said second multiplexer.

6. The system of claim 5, wherein each parallel in/parallel out register is configured to deliver (1, 2, . . . n) serial data vectors as inputs to said first multiplexer.

7. The system of claim 1, wherein each pin of each of said pin segments is coupled to each of said parallel in/parallel out shift registers by at least three multiplexers.

8. The system of claim 7 further comprising pin logic for each pin and comprising:
a first multiplexer;
a second multiplexer having an input coupled to an output of said first multiplexer; and, a third multiplexer having an input coupled to an output of said second multiplexer.

9. The system of claim 8, wherein said first multiplexer is coupled to a register for selecting an input serial data vector.

10. An automated test equipment (ATE) system comprising:
   a single memory for storing parallel and serial data vector sequences;
   a plurality of parallel in/parallel out shift registers, each having 2n outputs, coupled to said single memory; and,
   a plurality of pins, wherein each output of said parallel in/parallel out shift registers is coupled to a pin by a multiplexer and a register, and
   wherein every other output of each of said parallel in/parallel out shift registers is also coupled to n pins.

11. The system of claim 10, wherein every other output of said parallel in/parallel out shift registers is coupled to each of said n pins by a data selection circuit.

12. The system of claim 11, wherein said data selection circuit comprises at least three multiplexers.

13. The system of claim 12, comprising:
   a first multiplexer;
   a second multiplexer having an input coupled to an output of said first multiplexer; and,
   a third multiplexer having an input coupled to an output of said second multiplexer.

14. The system of claim 13, wherein said data selection circuit comprises a multiplexer having n inputs.

15. An automated test equipment (ATE) system comprising:
   a single memory for storing parallel and serial data vector sequences;
   a parallel in/parallel out shift register comprising 2n outputs, wherein n is an integer greater than 2, coupled to said single memory; and,
   2n pins, wherein each of said 2n pins are coupled to n outputs of said parallel in/parallel out shift register by a circuit comprising a multiplexer having n inputs.

16. The system of claim 15 wherein the n inputs of said multiplexer are coupled to every other output of said parallel in/parallel out shift register.

17. The system of claim 16, wherein each of said 2n outputs is coupled to one of said 2n pins by a circuit comprising a multiplexer with two inputs.

18. The system of claim 15, wherein each of said 2n outputs is coupled to one of said 2n pins by a circuit comprising a multiplexer with two inputs.

19. The system of claim 15, wherein n is an even integer.

20. The system of claim 19, wherein n is equal to 8.

21. An automated testing equipment (ATE) system comprising:
   a signal memory for storing both serial vector data and parallel vector data for application to tester pins, said single memory comprising a plurality of data outputs which are divided into a plurality of segments;
   a serial shift register comprising parallel inputs and parallel outputs, said serial shift register coupled to a segment of said plurality of segments and wherein each cell of said serial shift register receives a respective data output of said single memory; and
   a plurality of pin circuits coupled to said serial shift register, wherein each pin circuit is coupled to a respective tester pin and, wherein further, said plurality of pin circuits allow each tester pin to receive serial vector data from two or more cells of said serial shift register during serial operation.

22. The ATE system as described in claim 21 wherein said serial shift register comprises 2n cells and wherein said plurality of pin circuits further allow each tester pin to receive serial vector data from n cells of said serial shift register during said serial operation.

23. The ATE system as described in claim 22 wherein said plurality of pin circuits further allow each tester pin to receive a respective bit of parallel vector data during parallel operation.

24. The ATE system as described in claim 21 wherein said serial shift register comprises n cells and wherein said plurality of pin circuits further allow each tester pin to receive serial vector data from every other cell of said serial shift register during said serial operation.

25. The ATE system as described in claim 24 wherein said plurality of pin circuits further allow each tester pin to receive a respective bit of parallel vector data during parallel operation.

26. The ATE system as described in claim 21 wherein said plurality of pin circuits further allow two or more tester pins to receive the same serial vector data from a common cell of said serial shift register during said serial operation.

27. The ATE system as described in claim 26 wherein said plurality of pin circuits further allow each tester pin to receive a respective bit of parallel vector data during parallel operation.

28. The ATE system as described in claim 21 wherein said plurality of pin circuits further allow each tester pin to receive a respective bit of parallel vector data during parallel operation.

29. The ATE system as described in claim 21 wherein each pin circuit comprises:
   a first multiplexer for receiving a selected group of said parallel outputs of said serial shift register;
   a second multiplexer for receiving a respective output of said parallel outputs and also for receiving an output of said first multiplexer; and
   a sequential cell for receiving an output of said second multiplexer and for providing an output for coupling to a respective tester pin.

30. The ATE system as described in claim 29 wherein each pin circuit further comprises a third multiplexer coupled to receive said output of said sequential cell and also coupled to receive said output of said first multiplexer, said third multiplexer for supplying an output to an input of said second multiplexer, said third multiplexer controlled by a select line coupled to a scan enable signal.

31. An automated testing equipment (ATE) system comprising:
   memory for storing serial vector data and parallel vector data for application to tester pins, said memory comprising a plurality of data outputs which are divided into a plurality of segments;
   a serial shift register comprising parallel inputs and parallel outputs, said serial shift register coupled to a segment of said plurality of segments and wherein each cell of said serial shift register receives a respective data output of said memory; and
   a plurality of pin circuits coupled to said serial shift register, wherein each pin circuit is coupled to a respective tester pin and, wherein further, said plurality of pin circuits allow each tester pin to receive serial vector data from every other cell of said serial shift register during serial operation.

32. The ATE system as described in claim 31 wherein said plurality of pin circuits further allow two or more tester pins to receive the same serial vector data from a common cell of said serial shift register during said serial operation.

33. The ATE system as described in claim 32 wherein said plurality of pin circuits further allow each tester pin to receive a respective bit of parallel vector data during parallel operation.

34. The ATE system as described in claim 31 wherein said plurality of pin circuits further allow each tester pin to receive a respective bit of parallel vector data during parallel operation.

35. The ATE system as described in claim 34 wherein said plurality of pin circuits further allow each tester pin to receive a respective bit of parallel vector data during parallel operation.

36. The ATE system as described in claim 31 wherein each pin circuit comprises:
  a first multiplexer for receiving every other output of said parallel outputs of said serial shift register;
  a second multiplexer for receiving a respective output of said parallel outputs and also for receiving an output of said first multiplexer; and
  a sequential cell for receiving an output of said second multiplexer and for providing an output for coupling to a respective tester pin.

37. The ATE system as described in claim 36 wherein each pin circuit further comprises a third multiplexer coupled to receive said output of said sequential cell and also coupled to receive said output of said first multiplexer, said third multiplexer for supplying an output to an input of said second multiplexer, said third multiplexer controlled by a select line coupled to a scan enable signal.

38. The ATE system as described in claim 31 wherein said memory is a single memory.

* * * * *